United States Patent [19]

Endo et al.

[11] Patent Number: 5,087,578
[45] Date of Patent: Feb. 11, 1992

[54] SEMICONDUCTOR DEVICE HAVING MULTI-LAYERED WIRING

[75] Inventors: Kazuo Endo; Takashi Kimura, both of Yokohama, Japan

[73] Assignee: Kabushiki Kaisha Toshiba, Kawasaki, Japan

[21] Appl. No.: 420,727

[22] Filed: Oct. 11, 1989

Related U.S. Application Data

[60] Division of Ser. No. 265,354, Oct. 28, 1988, abandoned, which is a continuation of Ser. No. 42,889, Apr. 27, 1987, abandoned.

[30] Foreign Application Priority Data

Sep. 26, 1986 [JP] Japan .................. 61-227252

[51] Int. Cl.$^5$ .................. H01L 21/223; H01L 21/285
[52] U.S. Cl. .................. 437/31; 437/192; 437/195
[58] Field of Search ............ 357/68, 71, 23.1, 23.9, 357/73; 437/192, 195, 31; 148/DIG. 133

[56] References Cited

U.S. PATENT DOCUMENTS

| | | | |
|---|---|---|---|
| 3,614,547 | 10/1971 | May | 357/71 |
| 3,664,874 | 5/1972 | Epstein | 428/601 |
| 3,675,090 | 7/1972 | Neale | 357/71 |
| 3,935,635 | 2/1976 | Botzenhardt | 357/71 |
| 3,946,426 | 3/1976 | Sanders | 357/71 |
| 3,988,823 | 11/1976 | Hu | 357/71 |
| 4,309,224 | 1/1982 | Shibata | 357/23.9 |
| 4,348,746 | 9/1982 | Okabayashi et al. | 437/192 |
| 4,349,584 | 9/1982 | Flatley et al. | 437/239 |
| 4,363,830 | 12/1982 | Hsu et al. | 437/947 |
| 4,467,520 | 8/1984 | Shiotari | 357/23.12 |
| 4,502,209 | 3/1985 | Eizenberg et al. | 357/71 |
| 4,502,210 | 3/1985 | Okumura et al. | 357/71 |
| 4,571,816 | 2/1986 | Dingwall | 357/23.7 |
| 4,582,563 | 4/1986 | Hazuki et al. | 437/192 |
| 4,629,635 | 12/1986 | Brors | 437/202 |
| 4,631,564 | 12/1986 | Neilson et al. | 357/23.4 |
| 4,698,659 | 10/1987 | Mizutari | 357/71 |
| 4,733,289 | 3/1988 | Tsurumaru | 357/73 |
| 4,786,962 | 11/1988 | Koch | 437/192 |

FOREIGN PATENT DOCUMENTS

| | | | |
|---|---|---|---|
| 0057457 | 4/1984 | Japan | 437/195 |
| 0053050 | 3/1985 | Japan | 148/DIG. 133 |
| 0073350 | 4/1986 | Japan | 437/195 |

*Primary Examiner*—Olik Chaudhuri
*Assistant Examiner*—Ourmazd S. Ojan
*Attorney, Agent, or Firm*—Finnegan, Henderson, Farabow, Garrett, and Dunner

[57] ABSTRACT

A semiconductor device comprises a first electrode provided on a semiconductor substrate, and constituting a lower wiring layer, an insulating layer provided on the first electrode and the substrate, and a second electrode, which constitutes an upper wiring layer and is connected to the first electrode through a contact hole pierced through the insulating layer. The first electrode includes at least one of high melting point metal layer and high melting point metal silicide layer. The surface of the insulating layer is flattened by heat treatment.

2 Claims, 3 Drawing Sheets

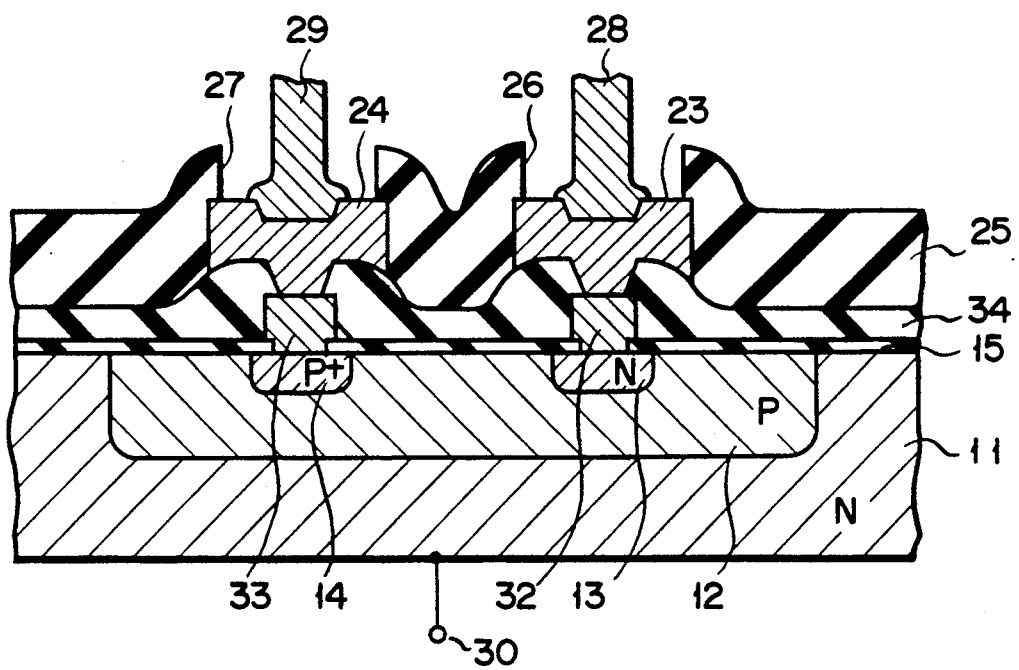
F I G. 2C
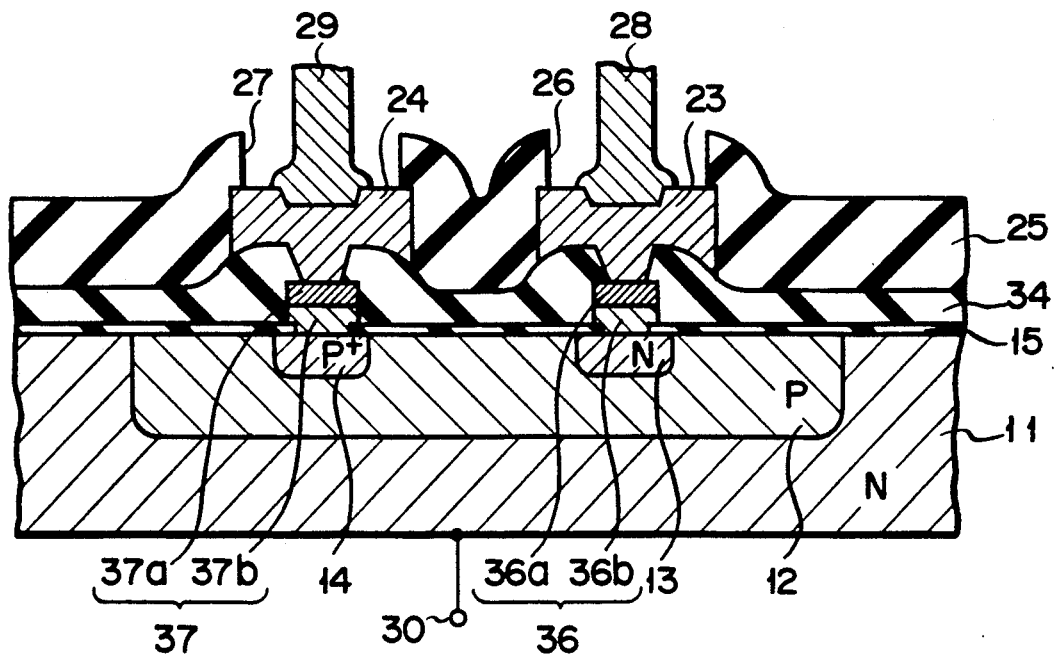
F I G. 3

SEMICONDUCTOR DEVICE HAVING MULTI-LAYERED WIRING

This application is a continuation-in-part, division of application Ser. No. 265,354, filed Oct. 28, 1988, now abandoned, which is a continuation of Ser. No. 042,889, filed Apr. 27, 1989, now abandoned.

FIELD OF THE INVENTION

The present invention relates to a semiconductor device having multi-layered wiring, and more particularly to a semiconductor device having an electrode connected to a bonding wire.

BACKGROUND OF THE INVENTION

A semiconductor device having double-layered wiring namely, a device having lower and upper wiring layers will be described as an example. This semiconductor device is manufactured as follows.

First, the lower wiring layer is provided on a semiconductor substrate. Next, an insulating layer is provided on both the lower wiring layer and the substrate. Finally, the upper wiring layer is provided on the insulating layer. Before this final step, the surface of the insulating layer must be flattened. Typically, a side wall method is used for flattening the surface of the insulating layer.

The case where the side wall method is used to the manufacture of a bipolar transistor will now be described, with reference to FIG. 1A to FIG. 1D.

Referring to FIG. 1A, N-type semiconductor substrate 11 is used as a collector region. In the surface region of substrate 11, P-type base region 12 is formed by impurity diffusion. Thereafter, N-type emitter region 13 and P+region 14 are formed in the surface region of base region 12. Next, SiO2 layer 15 is formed on the surface of region 11, in such a manner that regions 12, 13, and 14 are all covered by SiO2 layer 15. Contact holes are formed in those portions of SiO2 layer 15 which correspond to the locations of regions 13 and 14. After this, an Al layer is formed on the entire surface of SiO2 layer 15. By patterning this Al layer, emitter and base electrodes 16 and 17 are formed. Electrodes 16 and 17 are in contact with regions 13 and 14, respectively, and constitute a lower wiring layer. Next, CVD-SiO2 layer 18 is formed on the entire surface of SiO2 layer 15. CVD-SiO2 layer 18 is removed by reactive ion etching, but this etching is performed such that part 18a of CVD-SiO2 18 remains on the side walls of electrodes 16 and 17, as is shown in FIG. 1B. After this, CVD-SiO2 layer 19 is deposited over layer 15. After contact holes 21 and 22 are formed in layer 19, an Al layer is deposited over layer 19. By patterning this Al layer, electrodes 23 and 24, which constitute an upper wiring layer, are formed as shown in FIG. 1C. Thereafter, protecting film 25 is formed both on CVD-SiO2 layer 19 and on electrodes 23 and 24. Contact holes 26 and 27 are formed in those portions of protecting film 25 which correspond to the locations of electrodes 23 and 24, thereby these exposing these electrodes. Next, bonding wires 28 and 29 are bonded to the upper surface of electrodes 23 and 24, thereby enabling the base and emitter to be led to an external circuit. Terminal 30, used for leading the collector to an external circuit, is connected to the surface opposite to the main surface of substrate 11.

In the prior art semiconductor device mentioned above, the shape of CVD-SiO2 layer 18a remaining on the side walls of electrodes 16 and 17 is apt to vary greatly, depending on circumstances. Accordingly, the foundation on which electrodes 23 and 24 are formed is apt to vary in shape greatly, resulting in deterioration in the quality of the Al film. If this happens, migration is likely to occur in electrodes 23 and 24, so that the reliability of the contact portions between the electrodes of the upper wiring layer and those of the lower wiring layer will be degraded.

In the prior art semiconductor device, electrodes 16 and 17 of the lower wiring layer constituting the foundation are formed of Al, which is not very hard. Therefore, CVD-SiO2 film 19, which serves as an interlayer insulating film, is likely to crack if the wires are bonded directly to electrodes 23 and 24.

SUMMARY OF THE INVENTION

An object of the present invention is to overcome the problems and disadvantages of the prior art.

The object of the present invention is to provide a semiconductor device with multi-layered wiring, in which the surface of an insulating layer provided between lower and upper wiring layers is flattened by simple procedure, thus solving the problems mentioned above.

According to the present invention, there is provided a semiconductor device with multi-layered wiring, which comprises: a semiconductor substrate; a first electrode provided on the semiconductor substrate, for constituting a lower wiring layer, the first electrode including at least one of a layer formed of high melting point metal and a layer formed of high melting point metal silicide; an insulating layer provided on both the first electrode and semiconductor substrate, and having a surface substantially flattened by heat treatment; and a second electrode provided on the insulating layer, for constituting an upper wiring layer, the second electrode being connected to the first electrode through a contact hole formed in the insulating layer, and being subjected to wire bonding.

BRIEF DESCRIPTION OF THE DRAWINGS

The accompanying drawings, which are incorporated in and constitute a part of this specification, illustrate several embodiments of the present invention and together with the description, serve to explain the principles of the present invention.

FIGS. 2A to 2C are cross-sectional views showing manufacturing steps of a semiconductor device having multi-layered wiring, the semiconductor device being an embodiment according to the present invention; and FIG. 3 is a cross-sectional view of a semiconductor device of another embodiment according to the present invention.

DETAILED DESCRIPTION OF THE PREFERRED EMBODIMENTS

One embodiment of the present invention will now be described, with reference to the sectional views in FIGS. 2A to 2C. The same reference symbols as in FIGS. 1A to 1D are used to denote corresponding parts. The sectional views illustrate steps for manufacturing the device of the embodiment.

Figure 1A:
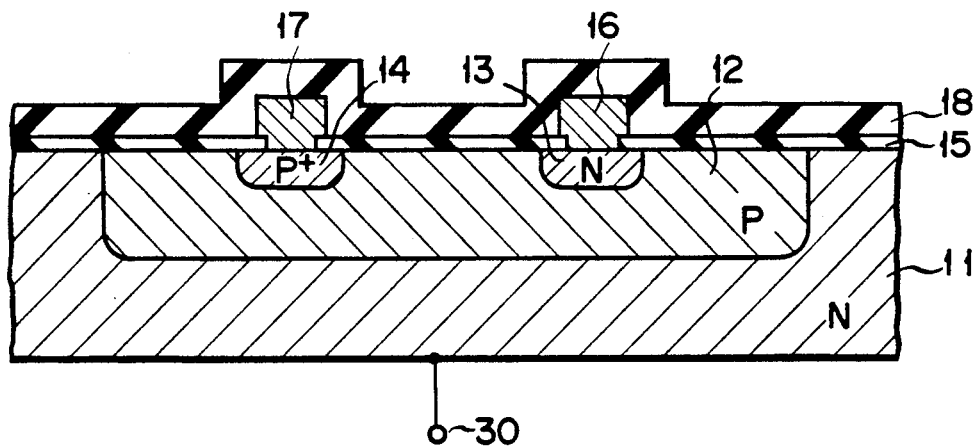
FIGS. 1A to 1D are cross-sectional views showing manufacturing steps of a prior art semiconductor device having multi-layered wiring.
Figure 1B:
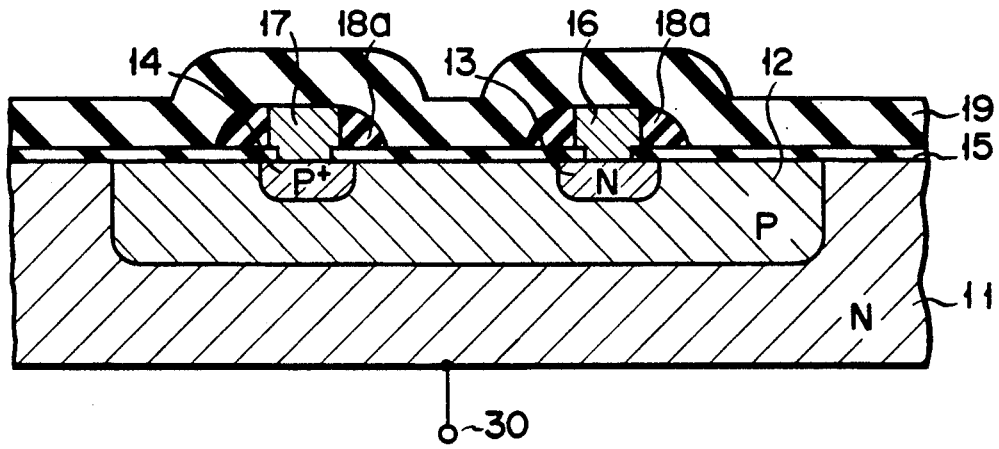
Figure 1C:
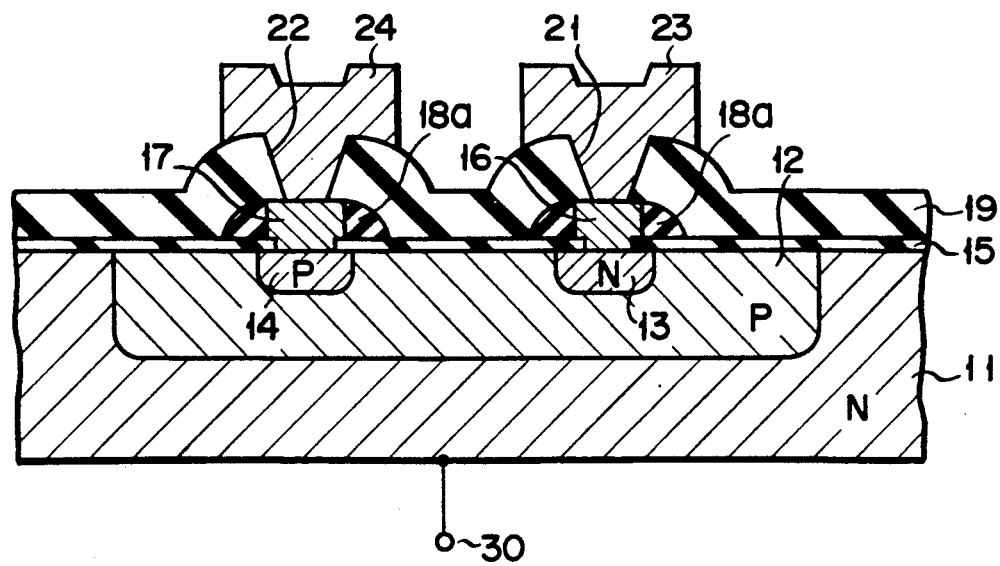
Figure 1D:
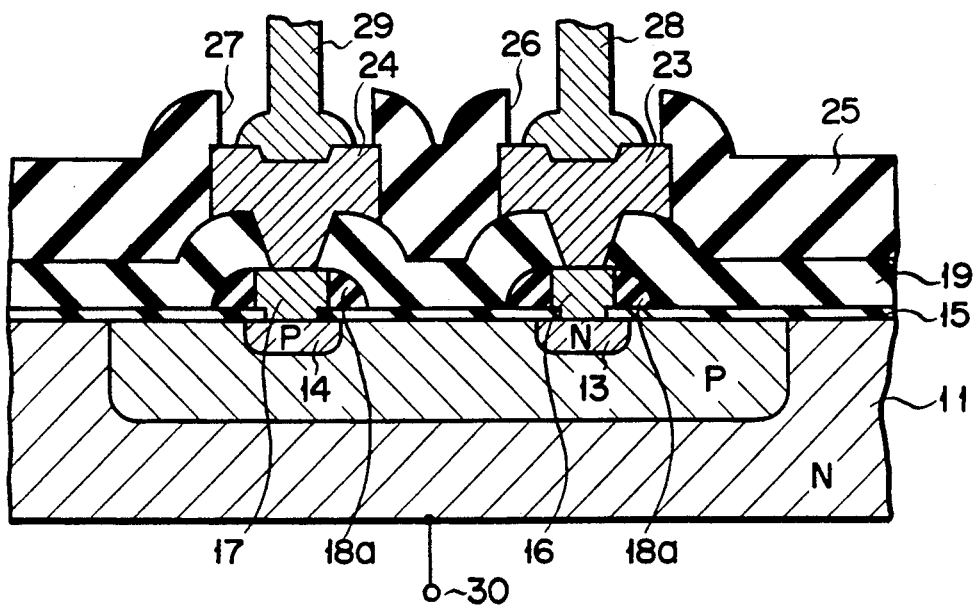
Figure 2A:
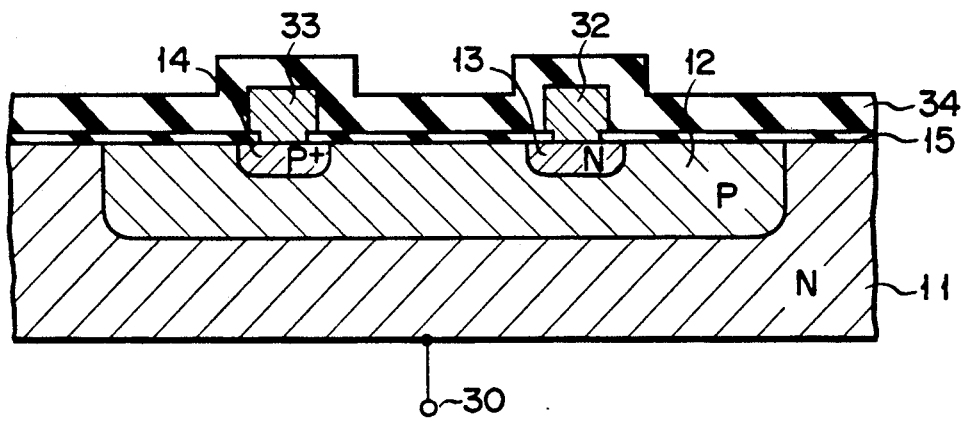

Referring first to FIG. 2A, P-type impurities are diffused in a surface region of N-type semiconductor substrate 11, thereby forming base region 12. N-type impurities are diffused in one surface region of base region 12, thereby forming emitter region 13. In addition, P-type impurities are diffused in another surface region of base region 12, thereby forming P+ region 14. SiO$_2$ layer 15 is formed over the entire main surface of semiconductor substrate 11, and contact holes are formed in those portions of SiO$_2$ layer 15 which correspond to the locations of regions 13 and 14. A layer of high melting point metal, such as Mo and MoSi, is formed on SiO$_2$ layer 15. By patterning this high melting point metal layer, emitter and base electrodes 32 and 33 are formed. As the material of the high melting point layer, W or Ti may be used instead of Mo. Similarly, WSi or TiSi may be used instead of MoSi. BPSG layer (boron phosphor silicate glass layer) 34 is deposited both on the entire surface of SiO$_2$ layer 15 and on electrodes 32 and 33. (See FIG. 2A.) Thereafter, the semi-processed product shown in FIG. 2A is subjected to heat treatment at a temperature of 1,000° C., thus crystallizing amorphous electrodes 32 and 33, and melting BPSG layer 34. As a result, the surface of BPSG layer 34 becomes substantially flat, as is shown in FIG. 2B. In the resultant structure, electrodes 32 and 33 constitute a lower wiring layer. Contact holes 21 and 22 are formed in those portions of BPSG layer 34 which correspond to the locations of electrodes 32 and 33, respectively (FIG. 2B). Next, an Al layer is formed on the entire surface of BPSG layer 34. By patterning this Al layer, electrodes 23 and 24 are formed. Insulating protection layer 25 is formed on layer 34 and electrodes 23 and 24. Contact holes 26 and 27 are formed in those portions of protection layer 25 which correspond to the locations of electrodes 23 and 24, respectively, thus exposing the surfaces of electrodes 23 and 24. Bonding wires 28 and 29 are bonded to the exposed surfaces, thus enabling the emitter and base to be lead to an external circuit. The collector is led out through terminal 30. Electrodes 23 and 24 constitute an upper wiring layer.

The advantages pertaining to the semiconductor device shown in FIG. 2C will now be described.

Electrodes 32 and 33 include a layer formed either of a high melting point metal or its silicide. Therefore, by forming BPSG layer 34 on such electrodes and partially melting BPSG layer 34 by heat treatment, the surface of BPSG layer 34 can be made substantially flat. In addition, electrodes 32 and 33 can be crystallized by this heat treatment. Furthermore, since the phospher contained in BPSG layer 34 serves to block the intrusion of alkali ions, a semiconductor element constituting the semiconductor device can be maintained in a stable condition. Furthermore, since the boron contained in BPSG layer 34 serves to lower the melting point of glass (BPSG layer 34), the BPSG layer can be melted at a temperature lower than that of a PSG layer, with the result that the surface of the BPSG layer can be flattened with ease. Finally, since the high melting point metal used to form electrodes 32 and 33 is harder than aluminum, BPSG layer 34 will not crack due to the pressure applied to electrodes 23 and 24 at the time of wire bonding.

Figure 2B:
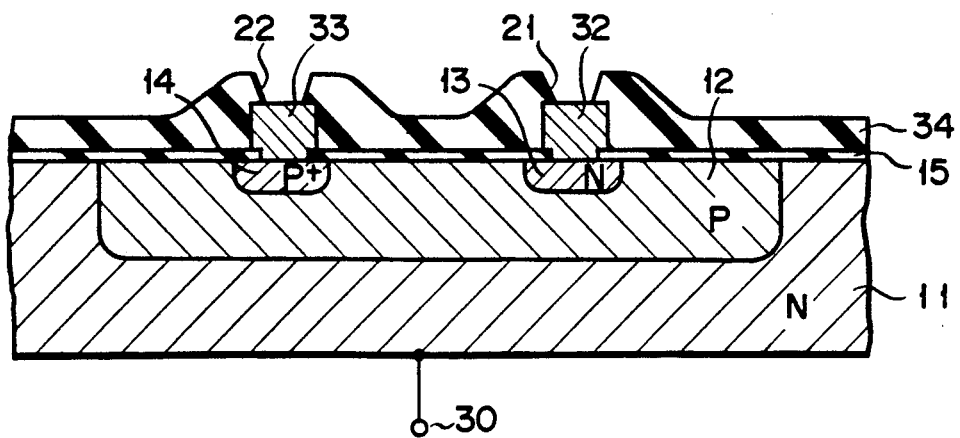

In the embodiment shown in FIGS. 2A to 2C, each of electrodes 32 and 33 is constituted by a single layer formed of a high melting point metal or its silicide. However, the present invention is not limited to the use of such electrodes. Each of electrodes 32 and 33 may be constituted by a composite structure including a plurality of layers, as is shown in FIG. 3. For example, electrode 36 may be a composite structure including layer 36a of a high melting point metal and layer 36b of a silicide of that metal. Similarly, electrode 37 may be a composite structure including layer 37a of a high melting point metal and layer 37b of a silicide of that metal. Further, each of the emitter and base electrodes may be a composite structure including three layers, namely, a first layer formed of a silicide of a high melting point metal; a second layer stacked over the first layer, and formed of a high melting point metal similar to that used in the first layer; and a third layer stacked over the second layer and formed of a silicide of the metal used in the second layer.

With such composite structures as mentioned above, the resistance of the electrodes can be reduced considerably.

Other embodiments of the present invention will be apparent to those skilled in the art from consideration of the specification and practice of the disclosed invention. It is intended that the specification and examples be considered as exemplary only, with the true scope and spirit of the invention being represented by the following claims.

What is claimed is:

1. A method of manufacturing a semiconductor device having multi-layered wiring, comprising the steps of:

diffusing impurities of a first conductivity type into a surface region of a semiconductor substrate of a second conductivity type, to form a base region;

diffusing impurities of the second conductivity type into a surface portion of said base region, to form an emitter region;

forming an insulation layer over the entire surface of the semiconductor substrate;

forming first contact holes in said insulation layer, which correspond, in locations, to the emitter and base regions;

forming a first metal layer on the insulation layer, said first metal layer including at least a metal silicide layer selected from the group consisting of MoSi, WSi, and TiSi.;

patterning the first metal layer formed on the insulation layer, to form first emitter and base electrodes;

depositing a boron phosphor silicate glass (BPSG) layer on the insulation layer and the emitter and base electrodes, to obtain a semiconductor structure, the first metal layer having a melting point higher than that of the BPSG layer;

heat treating the semiconductor structure at a predetermined temperature, to melt the BPSG layer for making the BPSG layer substantially flat;

forming second contact holes for the first base and emitter electrodes in the BPSG layer;

forming a second metal layer over the entire surface of the BPSG layer;

patterning the second metal layer, to form second base and emitter electrodes in contact with the first base and emitter electrodes; and bonding wires to the second base and emitter electrodes.

2. The method of manufacturing a semiconductor device having multi-layered wiring according to claim 1, wherein each of the first base and emitter electrodes is formed of a laminated layer including a metal layer selected from the group consisting of Mo, W, and Ti and a metal silicide layer selected from the group consisting of MoSi, WSi, and TiSi.

* * * * *

UNITED STATES PATENT AND TRADEMARK OFFICE
CERTIFICATE OF CORRECTION

PATENT NO. : 5,087,578
DATED : February 11, 1992
INVENTOR(S) : Kazuo ENDO et al.

It is certified that error appears in the above-identified patent and that said Letters Patent is hereby corrected as shown below:

On title Page, Title, after "WIRING" insert --AND METHOD OF MAKING THE SAME--.

Signed and Sealed this

Twenty-sixth Day of October, 1993

Attest:

BRUCE LEHMAN

Attesting Officer

Commissioner of Patents and Trademarks